United States Patent [19]
Koch

[11] 4,057,760
[45] Nov. 8, 1977

[54] FREQUENCY SYNTHESIZED SCANNER HAVING CONDUCTIVE PROGRAMMING ELEMENTS FOR CHANNEL SELECTION

[75] Inventor: Richard C. Koch, Denver, Colo.

[73] Assignee: Regency Electronics, Inc., Indianapolis, Ind.

[21] Appl. No.: 694,016

[22] Filed: June 7, 1976

[51] Int. Cl.² .......................................... H04B 1/06
[52] U.S. Cl. ............................... 325/455; 325/460; 325/464; 325/470; 325/335; 331/25
[58] Field of Search ............ 325/335, 423, 455, 456, 325/458–460, 464, 468, 462, 470, 25; 334/18; 331/2, 8, 18, 25, 36 C; 339/31–33; 200/51.02, 51.05, 51.09, 51 R, 46

[56] References Cited
U.S. PATENT DOCUMENTS

| | | | |
|---|---|---|---|
| 3,778,728 | 12/1973 | Nupp | 331/36 C X |
| 3,824,475 | 7/1974 | Pflasterer | 325/470 |
| 3,883,807 | 5/1975 | Alberkrack | 325/459 X |
| 3,886,453 | 5/1975 | Quintiliani et al. | 325/25 |
| 3,927,384 | 12/1975 | Jezo | 331/2 |
| 3,961,261 | 6/1976 | Pflasterer | 325/470 X |
| 3,962,644 | 6/1976 | Baker | 325/459 X |
| 3,980,951 | 9/1976 | Breeze et al. | 325/464 |
| 4,000,470 | 12/1976 | Okada | 325/470 |
| 4,009,439 | 2/1977 | Rast | 325/421 |

Primary Examiner—Robert L. Griffin
Assistant Examiner—Aristotelis M. Psitos
Attorney, Agent, or Firm—Woodard, Weikart, Emhardt & Naughton

[57] ABSTRACT

A multi-band radio receiver is disclosed for automatically and sequentially tuning to a plurality of discreet, separate preselected frequencies. The receiver incorporates a phase locked loop frequency synthesizer which includes two separate voltage tuned oscillators alternately operative according to the band of operation of the receiver. Channels are selected by inserting metal combs having teeth removed to form a binary coded memory into corresponding sockets in the receiver. One comb is used for each of the channels to which the receiver can tune. By replacing a specific comb with an alternate comb, the channel to which the receiver tunes can be correspondingly changed. The combs are made of relatively brittle aluminum in order that they may be readily programmed to the appropriate binary coded decimal arrangement of pins. Programming is accomplished by the simple bending and breaking of the appropriate teeth on the comb to achieve the desired binary coded information to achieve tuning to the desired frequency.

7 Claims, 7 Drawing Figures

FREQUENCY SYNTHESIZED SCANNER HAVING CONDUCTIVE PROGRAMMING ELEMENTS FOR CHANNEL SELECTION

BACKGROUND OF THE INVENTION

Signal seeking radio receivers of the type used to monitor public service bands are well known. These radio receivers monitor a plurality of discreet and separate channels sequentially and stop whenever a signal is received on a sampled channel. An example of one such prior art receiver is disclosed in U.S. Pat. No. 3,824,475 to Pflasterer. These receivers suffer from the shortcoming of requiring a separate crystal for each of the channels to which the receiver tunes. For radio receivers having a large number of channels, the cost of the large number of crystals required becomes rather substantial. Moreover, in order to change frequencies from those being used in the receiver, new crystals must be purchased to replace those undesired frequencies with the desired frequencies. Not only are the additional crystals expensive, but in addition the delay in ordering crystals for the desired frequencies can sometimes be substantial. Still further, crystals are occasionally defective, off frequency or inoperative when received from the crystal manufacturer thereby necessitating further delays. Certain crystal frequencies are not stocked and must be made to order, thus delaying useful operation of the receiver by the owner for a considerable time.

Phase locked loop circuits for use in synthesizing local oscillator frequencies have been known for many years. In prior art radio receivers of this type, a digital phase locked loop frequency synthesizer is often comprised of a reference oscillator, a phase detector, loop amplifier and filter, voltage tuned oscillator and digital divider. Such synthesizers are utilized to provide any one of a plurality of discrete frequencies for use in a variety of applications such as in scanning radio receivers which scan all channels from one end of a band to the other. The output terminal of the voltage tuned oscillator is connected to the input terminal of the divider, the output terminal of which is connected to an input terminal of the phase detector. The reference oscillator output terminal is connected to another input terminal of the phase detector. The output signal of the phase detector, which is proportional to the phase difference between the divider output signal and the reference oscillator signal, is fed back through the loop amplifier and filter to the voltage tuned oscillator, thus closing the loop.

With the reference frequency (obtained directly from an oscillator or by division from a stable higher frequency oscillator) less than the desired output frequency of the voltage tuned oscillator, the output frequency of the voltage tuned oscillator is divided by an integer $n$. The output of the divider is compared with the reference frequency within the phase detector and any phase difference is fed back to the voltage tuned oscillator in the form of a control voltage which corrects the frequency of the oscillator so that the frequency out of the divider becomes equal to the reference frequency and the loop is in lock.

By changing $n$ in integral steps, the output frequency of the synthesizer changes in steps equal to the reference frequency. Thus with a single crystal oscillator, many crystal controlled output frequencies are obtained. Automatic scanning using prior art techniques incorporating phase locked loop frequency synthesizers results in complex, expensive equipment of considerable size and weight. Often times electronic memories are incorporated within the units to retain the information relating to the desired frequencies to be scanned. Such electronic memories have the problem of being volatile and being modified by a loss of power to the receiver or electrical disturbances. Others require batteries to maintain the electronic memories. Once the electronic memory is lost, the receiver must again be reprogrammed to the desired frequency, often by quite cumbersome techniques.

Phase locked loop circuits in radio receivers of the prior art are not well suited to cover a very large frequency range. This is in part because the design of the voltage tuned oscillator normally restrains operation of the circuit to within certain limits which are less than are often desired for a multiple band receiver. The use of a field effect transistor in the voltage tuned oscillator to achieve a low noise oscillator makes the design of an oscillator to cover a broad band of frequencies difficult.

SUMMARY OF THE INVENTION

The precise nature of the invention is set forth in the claims and reference should be made thereto for a precise definition of the invention. In general, one aspect of the invention relates to a signal seeking scanning radio receiver which incorporates a frequency synthesizer for its local oscillator and in which the frequencies of the frequency synthesizer are determined by a plurality of electrically conductive contact members inserted into a plurality of sockets. A typical design for a receiver would have one socket corresponding to each channel that the receiver receives.

An appropriately fashioned conductive contact means would be inserted into a socket to determine the resultant frequency on the channel corresponding to the socket. The use of an electrically conductive means, such as a metal comb with teeth removed, avoids problems present in the prior art with electronic memories which fail with loss of power and under the influence of electrical noise or discharges. Moreover, the use of a metal comb for determining frequency is very inexpensive and readily accomplished. Still further, the conductive contact means such as a metal comb can be marked with clear identification to information relating to the frequency which it provides when used in the receiver. This allows for storage of a large number of frequencies according to the nature of the service which uses those frequencies rather than according to the actual multi-digit number of the frequency.

Another aspect of the invention relates to a signal seeking scanning radio receiver which incorporates a novel frequency synthesizer having two separate voltage tuned oscillators which operate alternately according to the band of operation within the same phase locked loop. In signal seeking radio receivers of the type disclosed, channels are sampled at a rapid rate. Therefore, the time within which the phase locked loop achieves a locked condition must be relatively rapid in comparison to the short sample time in order to give the receiver time to respond to any frequencies on the channels which are to be received. The use of two voltage tuned oscillators within the same phase locked loop overcomes many of the problems which would otherwise occur in attempting to generate frequencies over a very broad range of frequencies. Noise level can be reduced and response time increased with this arrangement.

BRIEF DESCRIPTION OF THE DRAWINGS

FIG. 1A is a basic block diagram of the receiver except for that portion which relates to the local oscillator and its control while FIG. 1B shows the local oscillator and the control logic accompanying it.

DESCRIPTION OF THE PREFERRED EMBODIMENT

Figure 1A:
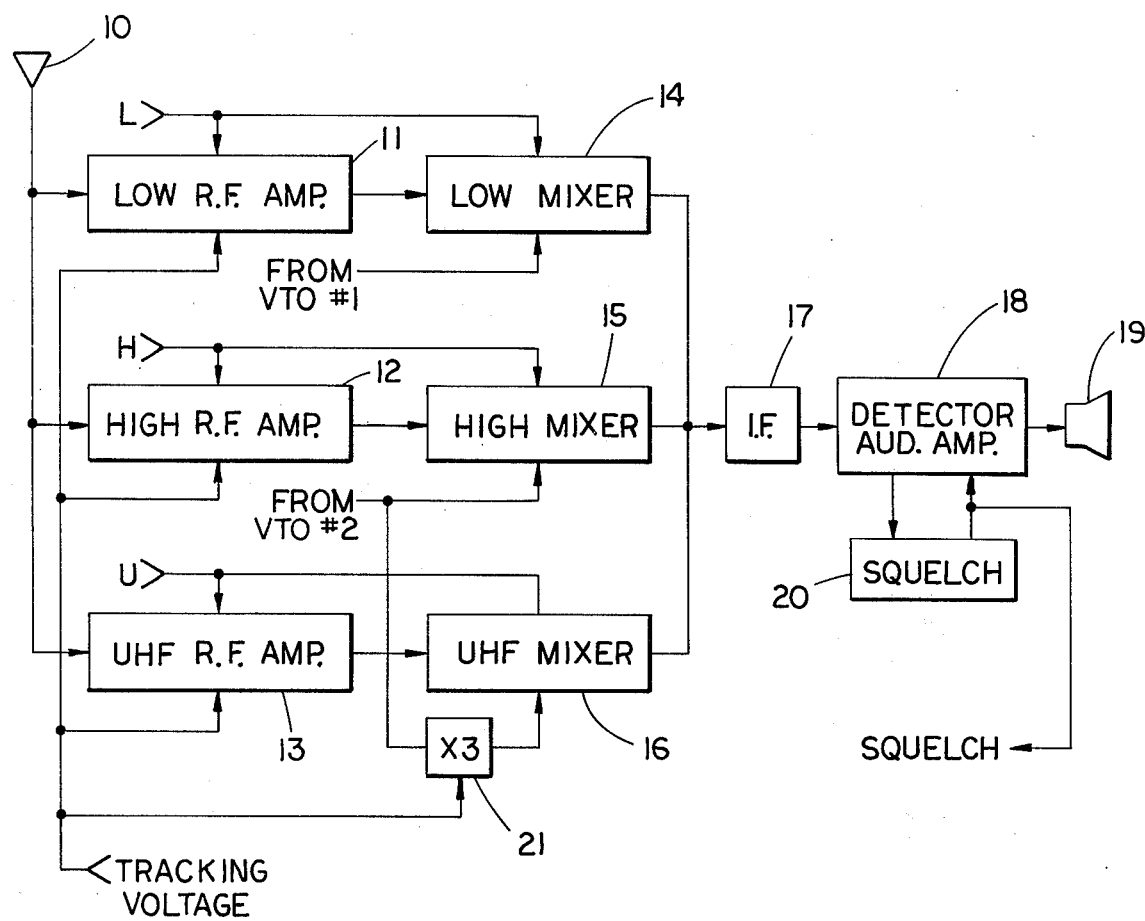
FIGS. 1A and 1B combined show a block diagram of the radio receiver embodying the claimed invention.
Figure 1B:
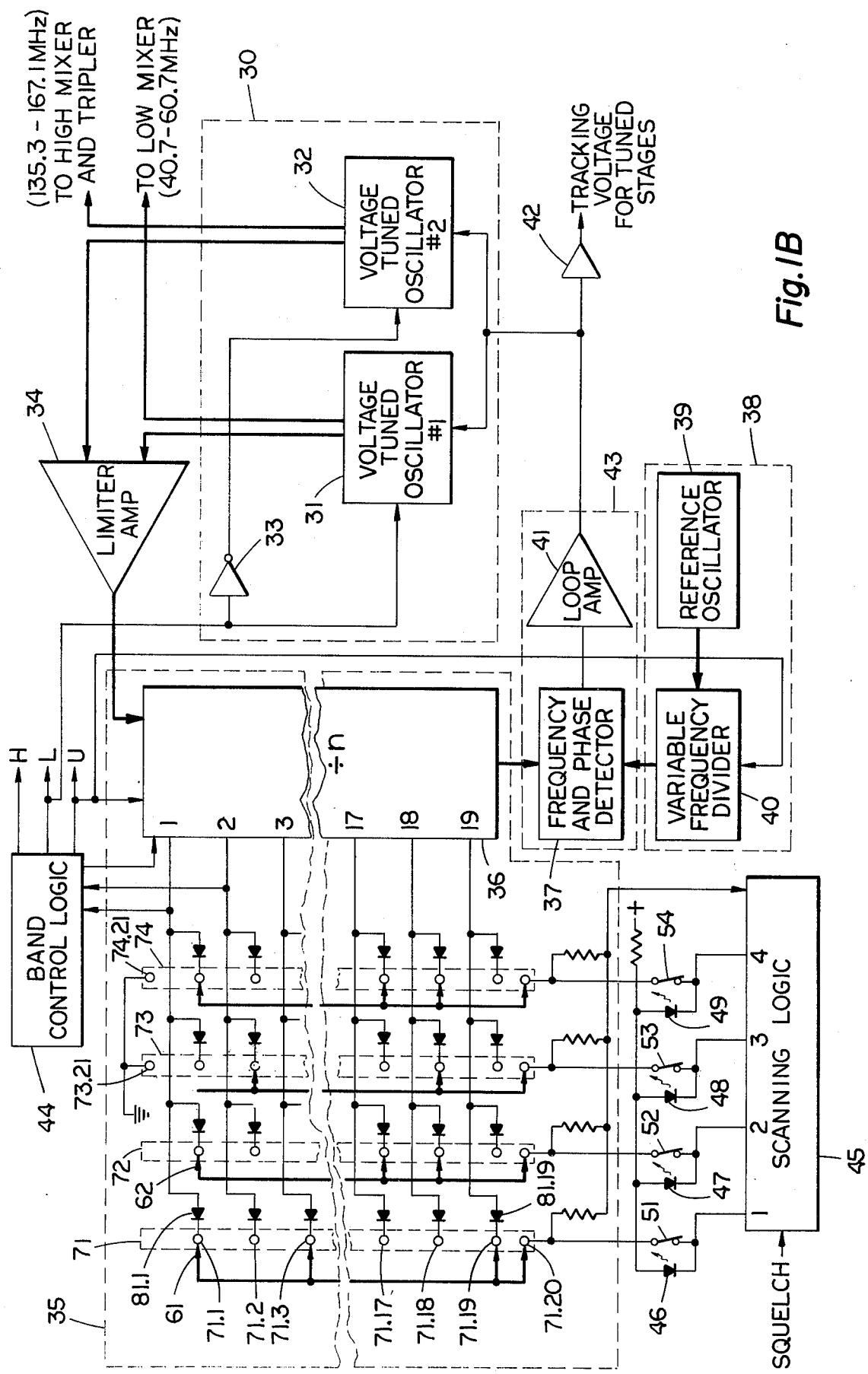

Referring in particular to FIGS. 1A and 1B there is illustrated a multiband stepping radio receiver for production of audio signals from radio frequency signals. This receiver is capable of tuning to several separate channels in any desired one or more band of three bands. Low band reception is designed to be between 30 and 50 MHz. High band reception is designed to be between 146 and 174 MHz. UHF band reception is designed to be between 440 and 512 MHz. An antenna 10 connects to the inputs of low band RF amplifier 11, high band RF amplifier 12 and UHF band RF amplifier 13. Together the antenna and RF amplifiers serve as an RF signal receiving means which operates in three bands to provide a sufficient RF signal level for the mixing stage of the radio receiver. The mixing stage of the radio receiver includes low mixer 14, high mixer 15 and UHF mixer 16.

The output of these mixers connects to a common input of IF stage 17 which operates initially at 10.7 MHz before a second conversion to 455 kHz. The phase or frequency modulated components of the output of IF stage 17 which fall within the audio spectrum are detected and amplified by detector and audio amp 18 and used to drive speaker 19 to provide audio. A squelch circuit 20 is present for preventing production of audio when an RF signal is not being received. IF stage 17, detector and audio amplifier 18 and squelch circuit 20 serve as an audio detection means which is coupled to the mixer for producing an audio signal when an RF signal is being received.

Figure 6:
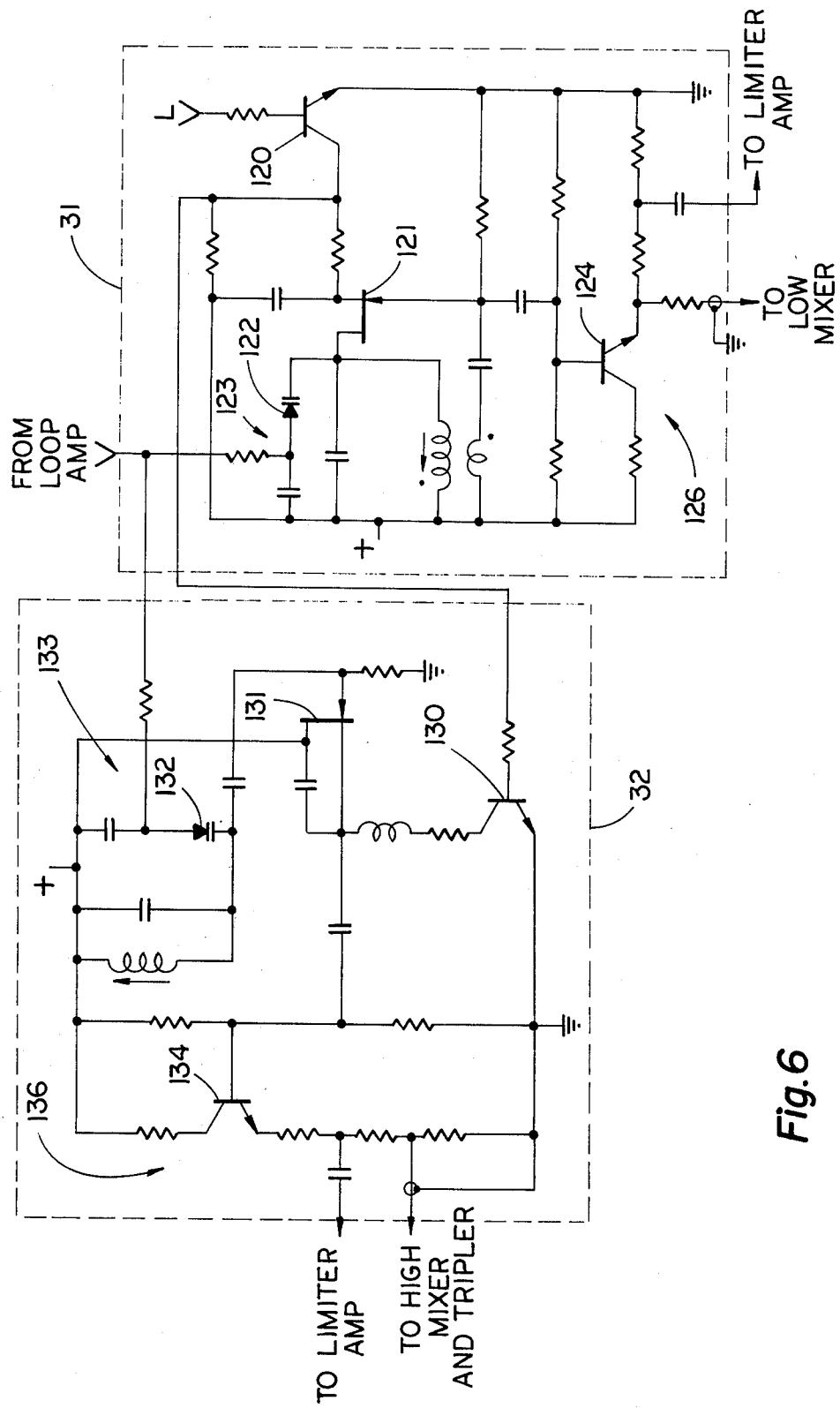
FIG. 6 illustrates the actual circuit diagrams for the two voltage tuned oscillators in the oscillator means of FIG. 1B.

The local oscillator signals for mixers 14-16 are obtained through an oscillator means which is shown primarily in FIG. 1B but which also includes a tripler stage 21 as shown in FIG. 1A. The oscillator means uses a frequency synthesizer and is operable at a given several frequencies, there being one frequency for each channel to which the receiver can tune. The frequency synthesizer uses a phase locked loop which includes voltage tuned oscillator means 30 for providing an oscillator output frequency corresponding to a voltage present at its input. The voltage tuned oscillator means 30 includes two separate voltage tuned oscillators 31 and 32. For clarity an inverting amplifier 33 is illustrated in FIG. 1B to illustrate the control of the voltage tuned oscillators 31 and 32. The enabling signals associated with the inverting amplifier 33 permit operation of only one of said voltage tuned oscillators at a time. A more accurate and detailed disclosure of the control circuit is shown in FIG. 6. The output of voltage tuned oscillator 31 connects to low mixer 14 and to a limiter amplifier 34. The output of voltage tuned oscillator 32 connects to high mixer 15 and to a parallel of limiter amplifier 34. Voltage tuned amplifier also connects to tripler 21 which provides the injection frequency for UHF mixer 16.

The output of limiter amplifier 34 is divided by an integer by digital divider 35. Digital divider 35 is adjustable in that a binary number controls the integer by which divide by n circuit 36 divides. The output of the digital divider 35 provides one input to the frequency and phase detector 37. The remaining input of the frequency and phase detector 37 is provided by a reference frequency circuit 38. Reference frequency circuit 38 includes a reference oscillator 39 which is crystal controlled and operates at 6.4 MHz. This frequency is then divided by variable frequency divider 40 to achieve a 5 kHz output during operation in the high band and low band and to achieve an output of 4.167 kHz when the receiver is operating in the UHF band. Through the use of conventional circuitry, the output frequency of the variable frequency divider 40 is reduced to five-sixth of its VHF band frequency when operating in the UHF band.

The outputs of digital divider 35 and reference frequency circuit 38 are compared in the frequency and phase detector 37 and the resultant comparison is filtered and amplified by the loop amplifier 41. The frequency and phase detector 37 together with the loop amplifier 41 provide a phase detection circuit 43 which provides a stable DC output voltage proportional to the phase difference between the outputs of digital divider 35 and reference frequency circuit 38. This output voltage then is used to close the loop and control whichever of the voltage tuned oscillators 31 or 32 is operating. The voltage is also used after being amplified by amplifier 42 to provide a tracking voltage for various tuned stages in the RF amplifiers 11-13 and in tripler 21.

The frequency determining data is parallel mode binary in form. As the term binary is used herein, it is not intended merely to refer to the pure binary numbering system, but rather it is intended to encompass any form of binary data including binary coded decimal. The parallel mode binary information is received on 19 inputs of the divide by n circuit 36. For clarity, only a few of the inputs have been numbered but it is to be understood that all of the inputs are actually present and would be numbered from 1-19 consecutively. Certain of the input lines not only carry information as to the appropriate divisor to be generated by the divide by n circuit 36 but also carry information from which can be determined the bands of operation of the radio receiver. A band control logic circuit 44 receives inputs from which it produces an output on either an H, L or U line corresponding to the band of the programmed frequency. The H, L and U lines connect to control which of the RF amps 11-13 and mixers 14-16 are supplied with power to operate. Additionally the L line controls voltage tuned oscillator 31 directly and in inverted form voltage tuned oscillator 32 to insure that the appropriate oscillator functions. The U line from the band control logic circuit 44 not only controls the divisor for variable frequency divider 40 but in addition it controls the mode of action of divide by *n* circuit 36 as will be described later with reference to FIG. 5.

There is illustrated in FIG. 1B a scanning logic circuit 45 which is of conventional design and may be, for example, of the design shown in U.S. Pat. No. 3,714,585 to Koch. The squelch signal from squelch circuit 20 functions as a locking means in conjunction with scanning logic circuit 45. It serves to defeat the stepping of scanning logic circuit 45 as long as an RF signal is being received, and allow resumption of operation of scanning logic circuit 45 when no signal is being received. Scanning logic circuit 45 functions in a manner to sequentially ground individual ones of its outputs at a rate of about 10 channels per second until such time as the operation is defeated by either manual controls as are conventionally provided with such circuits or by action of the squelch circuit 20. The state of the output of the scanning logic circuit 45 can be observed through the action of the light emitting diodes 46–49 which perform as electrically energizable visual indicators displaying the state of the output of the scanning logic circuit during normal scanning. Switches 51–54 are used in a conventional manner to remove any unwanted channels from the normal scanning sequence as shown in U.S. Pat. No. 3,714,585 to Koch.

In the practice of this invention, it is contemplated that the digital divider 35 will permit division of the output frequency from limiter amp 34 by a number corresponding to anyone of several different binary numbers. Each of the binary numbers would have at least 6 bits in the practice of this invention. The preferred embodiment uses a 19 bit number plus a control bit. Each of the binary numbers correspond to a particular channel to which the receiver is to be tuned. A binary number unique to each channel is generated in the receiver by the insertion of a comb into a corresponding socket.

As is illustrated, comb 61 is inserted into socket 71 and comb 62 is inserted into socket 72. Socket 71 has 20 individual electrical contact elements 71.1–71.20. To all but the last contact element 71.20, diodes 81.1–81.19 connect the corresponding contact elements 71.1–71.19 to input lines 1–19 of the divide by *n* circuit 36. Sockets 72, 73 and 74 are constructed and connected similarly to socket 71. Sockets 73 and 74, however, additionally have one extra electrical contact element 73.21 and 74.21 which are connected to ground and may be used for connection of external binary number generating equipment to control frequencies of the receiver when the scanning logic circuit 45 is in a state where either its third or fourth output is activated.

It can be observed that the last electrical contact element in each socket 71–74 does not couple through a diode to an input to the divide by *n* counter as do the majority of the remaining electrical contact elements but rather it is coupled to the respective one of the outputs of the scanning logic circuit 45.

Therefore, in operation, when the scanning logic circuit 45 has output 1 activated (and assuming switch 51 in the closed position as shown so as not to bypass that channel), electrical contact element 71.20 will be grounded due to its connection to output 1 of the scanning logic circuit 45. Since comb 61 has a tooth inserted into and in contact with electrical contact element 71.20 the comb will become grounded and all of its teeth which are present will become grounded. This will result in the grounding of those corresponding electrical contact elements in jack 71 which contact teeth of comb 61. This will in turn ground the corresponding inputs of the divide by *n* circuit 36 through the action of the diodes 81.1–81.19 which connect the electrical contact elements to the corresponding input lines 1–19 of the divide by *n* circuit 36.

Figure 2:
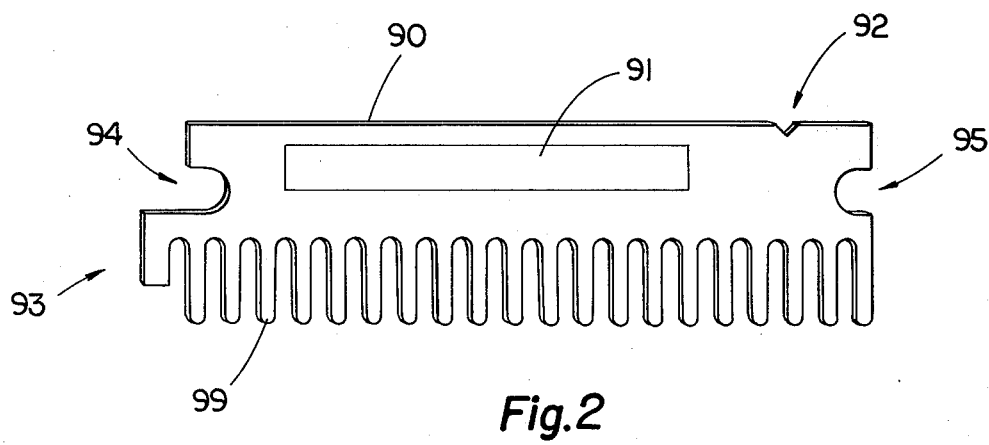
FIG. 2 illustrates a metal comb prior to being programmed for use in the local oscillator of FIG. 1B to determine a frequency of operation.

In FIG. 2 there is illustrated a metal comb suitable for use with the invention after having appropriate teeth removed to result in the desired binary number. The comb 90 of FIG. 2 includes a label 91 on which can be written information relating to the reception frequency which it provides. A notch 92 is provided which assists in orienting the comb when inserting it into a socket,. A stop 93, is of a width which prevents its insertion into a socket. Stop 93 assists in orientation and helps prevent inadvertent insertion of a comb in a position which is not in proper registry with the socket. Semi-circular cuts 94 and 95 assist in grasping the comb for removal from the socket.

The comb is made out of Alclad brand aluminum. Alcald is a trademark of Alcoa Aluminum and is used in connection with a strong, white aluminum alloy coated with pure aluminum to resist corrosion. In particular, Alcoa alloy 2024 T3 is perferred at a thickness of 0.032 in. More data with regard to the particular aluminum used is believed to be set forth in federal specification QQA 250/5e. The metal has a tensile strength of 65,000 psi and a yield strength of 45,000 psi. It has a hardness rating of 120 using a 500 Kg. load with a 10 mm. ball Brinell test.

Figure 3:
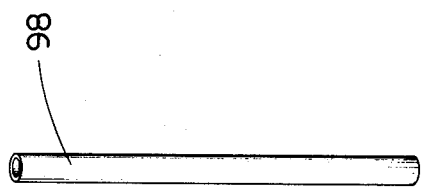
FIG. 3 illustrates a metal tube which is used to slide over a tooth of the comb of FIG. 2 to facilitate removal of the tooth by bending.
Figure 4:
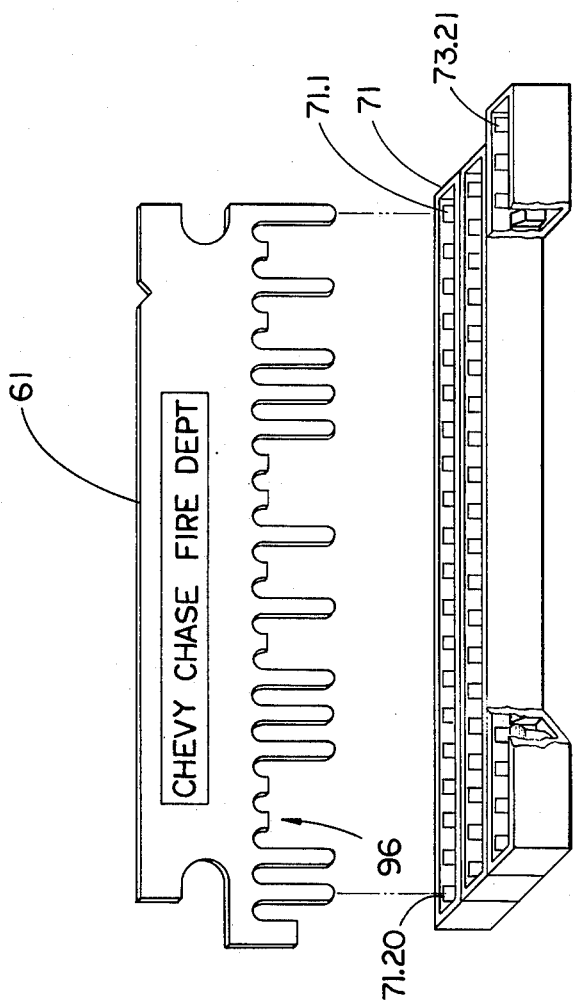
FIG. 4 illustrates a comb and a socket. The comb has been programmed to function to determine a frequency when inserted into the socket shown beneath it. The socket and comb of FIG. 4 are shown schematically in the oscillator of FIG. 1B.

When the tube 98 of FIG. 3 is fully inserted over a pin such as pin 99 of FIG. 2 and is bent with respect to the comb 90, a clean break occurs and the pin is readily removed. Notwithstanding that the teeth can be removed relatively easily through the use of tube 98, a programmed comb such as comb 61 of FIG. 4 is quite sturdy and can withstand substantial abuse. As shown in FIG. 4, comb 61 merely inserts into the socket 71. This will achieve programming of the receiver to a channel corresponding to the binary code of the teeth whenever the first output of the scanning logic circuit 45 is activated. The cleanly broken stub 96 as shown in FIG. 4 is much to short to come into contact with a corresponding electrical contact element of socket 71 when the comb is inserted.

While only 4 outputs of the scanning logic circuit are shown for purposes of clarity, it should be clearly understood that the number of outputs or the number of channels can be increased as desired to achieve the desired number of channels in the scanning radio receiver. Typically 10, 16 or 20 channels are found to be most desirable.

Figure 5:
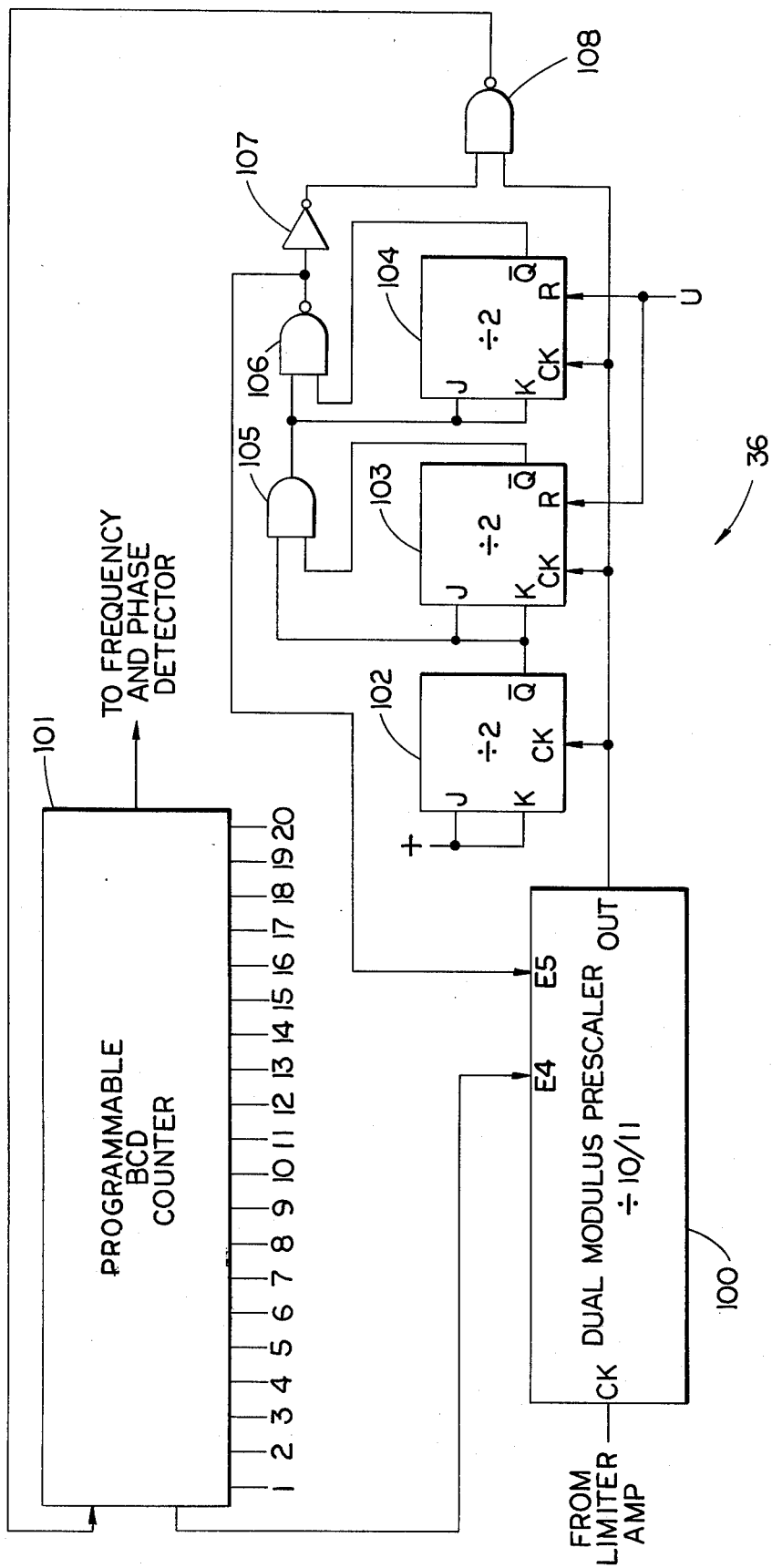
FIG. 5 illustrates in more detail the circuit of the divide by n circuit of the local oscillator of FIG. 1B.

Referring in particular to FIG. 5, there is illustrated in greater detail the divide by *n* circuit 36 of FIG. 1B The signal from the limiter amplifier 34 connects to the clock input of a dual modulus prescaler 100. Devices of this type are well known in the art. Preferably a Motorola MC12013 is used. This device serves to divide by 11 until a certain count is reached in the programmable BCD counter 101 at which time it converts to division by 10. It is known to modify a dual modulus prescaler such as prescaler 100 to function as a divide by 20/21 by the addition of an additional dividing circuit. In the preferred embodiment, JK flip-flop 102 functions to divide the output of the dual modulus prescaler by 2. Two additional JK flip-flops 103 and 104 are present.

However, the reset inputs R of flip-flops 103 and 104 connect to the UHF output of the band control circuit 44 shown in FIG. 1B. Thus, when a UHF signal is to be received by the receiver, the signal from the U line which connects to the reset inputs R of flip-flops 103 and 104 causes the dual modulus prescaler 100 in conjunction with flip-flops 102-104 and associated logic gates 105-108 to function as a divide by 80/81 dual modulus prescaler. However, when a UHF signal is not to be received by the receiver, the circuit functions as a divide by 20/21 dual modulus prescaler. Thus in effect there results a band-controlled, multi-modulus prescaler.

It is interesting to observe that the net effect of the various band controls functions in the logic circuit serves to shift the decimal point one digit in a decimal sense for the binary coded decimal input to the divide by $n$ circuit 36. It follows from the facts (1) that the divide by $n$ circuit changes by a factor of 4 in its count for the UHF band, (2) the voltage tuned oscillator 32 is changed by a factor of 3 by the tripler 21 for the UHF band and (3) the variable frequency divider 40 changes its division by a factor of 5/6. The product of these three factors (4 × 3 × 5/6) results in a change in the binary coded decimal input by a factor of 10, or simply a change of 1 decimal digit in the manner of coding the frequency information. Therefore, coding of the combs or connection of external code generating equipment can be based wholly upon the decimal system and can be thereby easier to comprehend and handle.

Referring more particularly to FIG. 6 there are illustrated in greater detail the circuit diagrams of voltage tuned oscillators 31 and 32. The L signal from the band control logic circuit 44 of FIG. 1B controls, through the action of transistor 120, the current through the field effect oscillator transistor 121 of the voltage tuned oscillator 31. The frequency of oscillation of the field effect transistor 121 is determined by the voltage applied on the varactor diode 122 from the loop amp 41 for FIG. 1B in association with the remaining parts of the LC circuit 123. A buffer stage 126 including transistor 124 is used to provide desired signal levels. As can be observed, the L signal is inverted by the action of transistor 120 and this inverted L signal connects to transistor 130 to control the current through the field effect oscillator transistor 131 of voltage tuned oscillator 32. A varactor 132 controlled LC circuit 133 controls the frequency of oscillation of the field effect transistor oscillator and again a buffer stage 136 with a transistor 134 is used.

While there have been described two oscillators which are alternately operable according to the band, it should be understood that one could also use band switching of tuning components of a single oscillator. It is intended that the complete switching in or out of reactive elements in a tuned circuit of a single oscillator or the complete switching of one tuned circuit in place of another in a single oscillator should be considered within the scope of claims not otherwise distinguished and directed to radios having a plurality of distinctly tuned oscillator means.

While there have been described above the principles of this invention in connection with specific apparatus, it is to be clearly understood that this description is made only by way of example and not as a limitation to the scope of the invention.

What is claimed is:

1. In a stepping radio receiver for production of audio signals from radio frequency signals and capable of tuning to several separate channels which radio receiver includes:
   a. an RF signal receiving means, a mixer means, and and oscillator means;
   b. said RF signal receiving means being for providing sufficient RF signal level for said mixer means;
   c. said RF signal receiving means and said oscillator means being coupled to said mixer means;
   d. an audio detection means coupled to said mixer means for producing an audio signal when an RF signal is being received, said audio detection means including squelch means for preventing the production of an audio signal when an RF signal is not being received:
   e. said oscillator means being coupled to said mixer means and operable at a given several frequencies, there being one frequency for each channel to which the receiver can tune; said oscillator means including a frequency synthesizer for determining the frequency of oscillation of said oscillator means;
   f. said frequency synthesizer including:
      1. voltage tuned oscillator means for providing an oscillator output frequency corresponding to a voltage present at its input,
      2. a binary-number-controlled digital divider coupled to the output of said voltage tuned oscillator, said digital divider including means permitting division by a number corresponding to any selected one of several different binary numbers, each of said several different binary numbers having at least 6 bits and corresponding to a channel to be tuned to;
      3. reference means for providing a reference frequency and
      4. phase detector means for providing a voltage in response to phase differences between the output of said digital divider and the output of said reference means,
   g. scanning logic means which is defeatable and which has several outputs which are coupled to said oscillator means for stepping said oscillator means through said given several frequencies;
   h. locking means which is connected to the scanning logic means for defeating said stepping means as long as an RF signal is being received and allowing resumption of operation of said scanning logic means when no signal is being received;

the improvement which comprises:
   said means permitting division by a number corresponding to any selected one of several different binary numbers including:
   1. several sockets, each socket having several electrical contact elements there being at least as many electrical contact elements as there are bits in said binary numbers,
   2. a majority of the corresponding electrical contact elements of said plurality of sockets each connecting through diodes to respective common lines,
   3. one contact element of each of said several sockets being coupled to a respective one of the outputs of said scanning logic means and
   4. a plurality of conductive contact means each inserted into a respective one of said several sockets to electrically connect said one contact element which is coupled to said scanning logic means to a portion of the remaining electrical contact elements of said respective one of said several sockets.

2. The receiver of claim 1 in which the electrical contact elements of each of said several sockets are linearly arranged.

3. The receiver of claim 1 in which said plurality of conductive contact means are metal combs.

4. The receiver of claim 3 in which said metal combs are made of an aluminum alloy.

5. The receiver of claim 1 in which additionally includes several switches and in which each of said one contact elements which couples to an output of said scanning logic means couples through a respective one of said several switches.

6. The receiver of claim 1 which additionally includes several electrically energizable visual indicators, each one being coupled to a respective one of said one contact elements of said several sockets which couples to a respective output of said scanning logic means.

7. The receiver of claim 6 which additionally includes several switches and in which each of said one contact elements which couples to an output of said scanning logic means couples through a respective one of said several switches.

* * * * *